(12) United States Patent
Huang et al.

(10) Patent No.: US 10,672,940 B2
(45) Date of Patent: Jun. 2, 2020

(54) HIGH-RESISTIVITY SINGLE CRYSTAL ZINC OXIDE WAFER BASED RADIATION DETECTOR AND PREPARATION METHOD AND USE THEREOF

(71) Applicant: SUN YAT-SEN UNIVERSITY, Guangdong (CN)

(72) Inventors: Feng Huang, Guangdong (CN); Xu Ji, Guangdong (CN); Mei Dong, Guangdong (CN); Kun Yan, Guangdong (CN)

(73) Assignee: SUN YAT-SEN UNIVERSITY, Guangdong (CN)

( * ) Notice: Subject to any disclaimer, the term of this patent is extended or adjusted under 35 U.S.C. 154(b) by 0 days.

(21) Appl. No.: 16/212,568

(22) Filed: Dec. 6, 2018

(65) Prior Publication Data

US 2019/0115489 A1    Apr. 18, 2019

Related U.S. Application Data

(63) Continuation of application No. PCT/CN2016/095817, filed on Aug. 18, 2016, and a
(Continued)

(30) Foreign Application Priority Data

Jul. 29, 2016   (CN) ............................ 2016 1 0612939
Jul. 29, 2016   (CN) ............................ 2016 1 0612940

(51) Int. Cl.
*H01L 21/00*   (2006.01)
*H01L 31/18*   (2006.01)
(Continued)

(52) U.S. Cl.
CPC .......... *H01L 31/1828* (2013.01); *C30B 29/16* (2013.01); *C30B 33/04* (2013.01);
(Continued)

(58) Field of Classification Search
CPC ............ H01L 31/1828; H01L 31/0224; H01L 31/085; H01L 31/02002; H01L 31/0296; C30B 33/04; C30B 29/16
(Continued)

(56) References Cited

U.S. PATENT DOCUMENTS

| 3,924,020 A | 12/1975 | Shank, Jr. |
| 2014/0042875 A1 | 2/2014 | Suenaga et al. |
| 2016/0170032 A1* | 6/2016 | Danzer ................... G01T 1/00 250/370.09 |

FOREIGN PATENT DOCUMENTS

| CN | 101814601 | 8/2010 |
| CN | 103794674 | 5/2014 |
| CN | 105742393 | 7/2016 |

OTHER PUBLICATIONS

Haruyuki Endo, "Fabrication and characterization of a ZnOX-ray sensor using a high resistivity ZnO single crystal grown by the hydrothermal method"; Nuclear Instruments and Methods in Physics Research A 665 Nov. 2011 (Year: 2011).*

(Continued)

*Primary Examiner* — Vu A Vu
(74) *Attorney, Agent, or Firm* — JCIPRNET (57) ABSTRACT

The present invention discloses a high-resistivity single crystal zinc oxide (ZnO) wafer and a high-resistivity single crystal ZnO-based radiation detector, and preparation method and use thereof. The preparation method of the high-resistivity single crystal zinc oxide wafer is to place a single crystal ZnO wafer in a metal lithium electrochemical device for a constant-current discharge treatment, and then to place the single crystal ZnO wafer in a high-pressure oxygen atmosphere at 800 to 1000° C. and 10 to 30 atm for an annealing treatment for 20 to 28 hours. The preparation method of the radiation detector is to evaporate a metal electrode layer at both sides of the high-resistivity single
(Continued)

crystal ZnO wafer, then to bond the wafer onto a circuit board, and to connect the wafer with the circuit board by a gold thread.

20 Claims, 4 Drawing Sheets

Related U.S. Application Data continuation of application No. PCT/CN2016/095816, filed on Aug. 18, 2016.

(51) Int. Cl.
    *C30B 29/16*    (2006.01)
    *C30B 33/04*    (2006.01)
    *H01L 31/02*    (2006.01)
    *H01L 31/08*    (2006.01)
    *H01L 31/0224*    (2006.01)
    *H01L 31/0296*    (2006.01)

(52) U.S. Cl.
    CPC .... *H01L 31/02002* (2013.01); *H01L 31/0224* (2013.01); *H01L 31/0296* (2013.01); *H01L 31/085* (2013.01)

(58) Field of Classification Search
    USPC .......................................................... 438/56
    See application file for complete search history.

(56) References Cited

OTHER PUBLICATIONS

Fu et al., "The Electrochemical Reaction of Zinc Oxide Thin Films with Lithium", Journal of the Electrochemical Society, Apr. 11, 2003, pp. A714-A720.

\* cited by examiner

HIGH-RESISTIVITY SINGLE CRYSTAL ZINC OXIDE WAFER BASED RADIATION DETECTOR AND PREPARATION METHOD AND USE THEREOF

CROSS-REFERENCE TO RELATED APPLICATION

This application is a continuation of international PCT application serial no. PCT/CN2016/095816, filed on Aug. 18, 2016, which claims the priority benefit of China application no. 201610612939.2, filed on Jul. 29, 2016, and a continuation of international PCT application serial no. PCT/CN2016/095817, filed on Aug. 18, 2016, which claims the priority benefit of China application no. 201610612940.5, filed on Jul. 29, 2016. The entirety of each of the above-mentioned patent applications is hereby incorporated by reference herein and made a part of this specification.

TECHNICAL FIELD

The present invention belongs to the technical field of radiation detector, and more specifically, relates to a high-resistivity single crystal zinc oxide wafer and a radiation detector, and a preparation method and use thereof.

BACKGROUND

In many fields of military, national defense, aerospace, etc., detectors need to have characteristics such as high sensitivity, miniaturization, and strong anti-irradiation capability. Compared to an average radiant energy (~30 eV) required by a conventional gas radiation detector to generate a detection signal by gas ionization, a semiconductor material requires an average radiant energy of <10 eV for generating a pair of electron-hole pairs, and thus at the same radiant energy, especially for a weak signal, a sensitivity of the semiconductor materials is higher than that of the gas. In the meantime, since the semiconductor material has a density greater than the gas, a very thin layer of the semiconductor material (a few microns) can effectively convert the absorbed radiant energy, which has a natural advantage in device miniaturization. Moreover, a mechanical strength of the semiconductor material itself can be well self-supporting, and it is convenient to integrate and construct a detector array, thereby realizing an acquisition of target position information. The research of semiconductor nuclear radiation detector has been going on for more than half a century. It has been widely used in many fields such as nuclear science, astronomy, cosmo physics, nuclear energy utilization, industrial automation, nuclear power plant, nuclear medicine imaging, anti-terrorism and environmental monitoring.

At present, due to the maturity of the device technology, the advantages of materials, and the well-developed microelectronic processing technology, the elemental semiconductor-based X-ray detector represented by Group IV silicon and germanium are developed at the earliest, and the first generation of semiconductor materials, represented by silicon and germanium, have developed a more mature fabrication technology for the detector. Compared with silicon, germanium has the advantage of its relatively large atomic number and low energy for electron-hole pair generation, which makes a germanium-based detector have higher efficiency and energy resolution.

However, both silicon and germanium are sensitive to ambient temperature and weak in radiation resistance due to their narrow band gap, so it is greatly restricted to equip them into a system working in space environment. On the other hand, for compound semiconductors, such as Group III-V compound GaAs, InGaAs and GaN, Group II-VI compound CdTe (energy resolution 0.3% @ 662 keV gamma ray, requires Peltire refrigeration) and CdZnTe, Group VII-μ dibasic halogen compounds $HgI2$, $PbI2$, TlBr and their ternary compound HgCdTe, etc., most of these materials have the disadvantages of low melting point, easy decomposition, and weak anti-irradiation capability, and stability and reliability of performance of the device constructed based on these materials is difficult to guarantee. These problems greatly limit the application of related detectors in harsh environments such as nuclear power plant and space.

In contrast, ZnO wide bandgap semiconductor materials with superior anti-irradiation capability, wider band gap, and higher breakdown electric field strength have attracted attention gradually. However, how to obtain high resistivity and thereby strongly suppress dark current noise in order to obtain high-resistivity single crystal ZnO with high signal-to-noise ratio has been an important obstacle hindering its application in the field of radiation detection.

SUMMARY OF THE INVENTION

The technical problem to be solved by the present invention is to overcome the shortcomings and deficiencies of the above-described prior art, providing a preparation method of high-resistivity single crystal ZnO for a radiation or photoelectric detector. This method uses an electrochemical method combined with an annealing treatment to obtain an ultra-high resistivity single crystal ZnO wafer. The preparation method is novel, simple to operate, low in cost and high in repeatability. Further, a semiconductor device for alpha particle detection is prepared based on the high-resistivity single crystal zinc oxide material. The present invention utilizes a high-resistance ZnO material having excellent characteristics such as a superior anti-irradiation capability, a wider band gap, and higher breakdown electric field strength to manufacture a radiation detector, and the obtained device exhibits a good radiation response and has a simple structure, a low cost and a high repeatability.

An object of the present invention is to provide a preparation method of high-resistivity single crystal zinc oxide.

Another object of the present invention is to provide a high-resistivity single crystal ZnO-based radiation detector.

Yet another object of the present invention is to provide use of the high-resistivity single crystal zinc oxide wafer and the high-resistivity single crystal ZnO-based radiation detector.

The above-described objects of the present invention are realized by the following technical solution:

the present invention provides a preparation method of high-resistivity single crystal zinc oxide, and the preparation method comprises following steps:

S1) placing a single crystal ZnO wafer in a metal lithium electrochemical device, for a constant-current discharge treatment; this step utilizes a difference in natural chemical potential of lithium and ZnO, and adopts a controllable discharge process to achieve efficient injection of lithium into a ZnO single crystal; and S2) placing the ZnO single crystal treated in the step S1 in an oxygen atmosphere furnace at 600 to 1000° C. and 5 to 30 atm for an annealing treatment for 10 to 28 hours, removing lithium metal to obtain a high-resistivity ZnO single crystal wafer.

In particular, the single crystal ZnO wafer mentioned in the step S1 is a low-resistance and high-quality single crystal ZnO wafer.

Preferably, an electrolyte in the metal lithium electrochemical device mentioned in the step S1 is a 0.5 to 1.5M $LiPF_6$ solution dispersed in a mixed solution of ethylene carbonate, ethyl methyl carbonate and diethyl carbonate in a volume ratio of 2 to 5:2 to 4:2 to 4, a Celgard 2400 polyethylene microporous membrane is used as an electronic separator.

More preferably, the electrolyte in the metal lithium electrochemical device mentioned in the step S1 is a 1M $LiPF_6$ solution dispersed in the mixed solution of ethylene carbonate, ethyl methyl carbonate and diethyl carbonate with a volume ratio of 4:3:3.

As a preferred implementable solution, the metal lithium electrochemical device mentioned in the step S1 is a lithium battery shell. In use, the ZnO wafer is placed in a commercial lithium battery structure for the constant-current discharge treatment.

Preferably, a means of placing the single crystal ZnO wafer in the metal lithium electrochemical device mentioned in the step S1 is specifically assembling the single crystal ZnO wafer into the lithium battery shell in following order: an anode shell, the single crystal ZnO wafer, a polyethylene microporous membrane, a metal lithium sheet, an internal electrode, a spring electrode, a cathode shell, with an outer ring being an insulating jacket layer.

Preferably, the constant-current discharge treatment mentioned in the step S1 is a 1 to 4 µA constant-current discharge treatment for 10 to 25 hours.

Preferably, the constant-current discharge treatment mentioned in the step S1 is a 3 µA constant-current discharge treatment for 15 hours.

In addition, preferably, the single crystal ZnO wafer mentioned in the step S1 has a size of 10 centimeter squares.

Preferably, the single crystal ZnO wafer mentioned in the step S1 has a thickness of 0.2 to 0.5 millimeters.

More preferably, when the thickness of the single crystal ZnO wafer is 0.2 millimeters, the 3 µA constant-current discharge treatment is performed for 10 hours; when the thickness of the single crystal ZnO wafer is 0.3 millimeters, the 3 µA constant-current discharge treatment is performed for 15 hours; when the thickness of the single crystal ZnO wafer is 0.5 millimeters, the 3 µA constant-current discharge treatment is performed for 25 hours.

Preferably, in the step S2, the ZnO single crystal treated in the step S1 is placed in an oxygen atmosphere at 800 to 1000° C. and 10 to 30 atm for the annealing treatment for 20 to 28 hours.

More preferably, in the step S2, the ZnO single crystal treated in the step S1 is placed in the oxygen atmosphere furnace at 800 to 900° C. and 15 to 25 atm for the annealing treatment for 22 to 26 hours.

The most preferably, in the step S2, the ZnO single crystal treated in the step S1 is placed in a high-pressure oxygen atmosphere furnace at 800° C. and 20 atm for the annealing treatment for 24 hours.

In addition, the high-resistivity single crystal ZnO wafer prepared by the above-described method, and use of the high-resistivity single crystal ZnO wafer in preparing a radiation detector or a photoelectric detector, are all within the scope of protection of the present invention.

In addition, based on the above-described prepared high-resistivity single crystal ZnO wafer, the present invention further provides a preparation method of a high-resistivity single crystal ZnO-based radiation detector. This method is to evaporate a metal electrode layer at both sides of the high-resistivity single crystal ZnO wafer, then to bond the treated wafer onto a circuit board, and to connect the wafer with the circuit board by a gold thread.

In particular, preferably, a means of evaporating is a thermal evaporation method or an electron beam evaporation method.

Preferably, the metal of the metal electrode layer has a purity of 999 to 9999.

Preferably, a specific means of bonding the wafer onto the circuit board is: melting the metal layer at a side by heating, binding the wafer onto the circuit board by the molten metal.

Preferably, evaporating the metal electrode layer at the both sides of the high-resistivity single crystal ZnO wafer specifically refers to: (1) evaporating an inner metal layer and an outer metal layer at a side of the high-resistivity single crystal ZnO wafer; the inner metal layer being a nickel layer or a titanium layer, the outer metal layer being a gold layer; (2) evaporating an indium layer at an other side of the high-resistivity single crystal ZnO wafer, or also evaporating the inner metal layer and the outer metal layer; the inner metal layer being a nickel layer, a titanium layer or an aluminum layer, the outer metal layer being a gold layer or a silver layer. Further preferably, an indium layer is finally evaporated on one side.

Preferably, the nickel layer has a thickness of 4 to 6 nm.
More preferably, the thickness of the nickel layer is 5 nm.
Preferably, the titanium layer has a thickness of 5 to 50 nm.
More preferably, the thickness of the titanium layer is 35 nm.
Preferably, the gold layer has a thickness of 10 to 50 nm.
More preferably, the thickness of the gold layer is 20 nm.
Preferably, the indium layer has a thickness of 1 µm to 500 µm.

In addition, the high-resistivity single crystal ZnO-based radiation detector prepared by the above-described method, and use of the high-resistivity single crystal ZnO-based radiation detector in preparing the radiation detector, are also within the scope of protection of the present invention.

The research of preparing the high-resistivity single crystal ZnO-based radiation detector according to the present invention includes following key points:

(1) the high-quality high-resistivity single crystal ZnO wafer is used as a core functional component of the radiation detector;

(2) preparation of an electrode is performed on the ZnO single crystal wafer using a thermal evaporation method and an electron beam evaporation method; and (3) the device is irradiated with an alpha source to test a response of the device to radiation.

The present invention has following beneficial effects.

The present invention first provides a preparation method of high-resistivity single crystal ZnO for a radiation or photoelectric detector. This method uses an electrochemical method combined with an annealing treatment to obtain an ultra-high resistivity single crystal ZnO wafer in only two simple steps. The obtained ZnO wafer has a resistivity of up to $10^{11}$ Ωcm. Moreover, the preparation method of the present invention is novel, simple in operation, low in cost and high in repeatability, and has good promotion and application prospects.

Further, the present invention, based on the above-described obtained high-resistivity single crystal zinc oxide wafer, provides a preparation method of a high-resistivity single crystal ZnO-based radiation detector, and verifies its response to low beam single or dual energy alpha source, showing a good radiation response.

The present invention uses a high-resistance ZnO material having excellent characteristics such as a superior anti-irradiation capability, a wider band gap, and higher breakdown electric field strength to manufacture a radiation detector. The obtained device has a simple structure, a simple manufacturing process, a low cost, a high repeatability, a high practicability, and good promotion and application prospects.

Moreover, the present invention uses the high-quality and high-resistivity ZnO single crystal as a functional material, which has strong anti-radiation capability, which determines that the device can work under strong radiation conditions such as nuclear science technical field and space.

The present invention adopts a more mature method of thermal evaporation or electron beam evaporation, which has the characteristics of uniform and controllable film thickness, ensures high electrode quality, can realize electrode evaporating of most metals, and provides a wide manufacturing space for electrode selection and control of device performance.

The present invention uses a single-energy alpha source with a low beam current as a radiation source, which can better reflect a sensitivity of the device to a detection signal, and can better reflect a discrimination of the device on detected signal energy.

DETAILED DESCRIPTION OF THE PREFERRED EMBODIMENT

The present invention is further described below in combination with accompanying drawings and specific embodiments, but the embodiments do not intend to limit the present invention in any form. Unless otherwise stated, reagents, methods and apparatus adopted in the present invention are conventional reagents, methods and apparatus in the art.

Unless otherwise stated, reagents and materials used in the present invention are commercially available.

Embodiment 1

1. Preparation of High-Resistivity ZnO Single Crystal (1) A high-quality low-resistance zinc oxide wafer of 10 centimeter squares was assembled into a commercial CR 2032 battery case in the order shown in FIG. 1 at room temperature in an argon-filled glove box, an electrolyte used was a 1 M LiPF6 solution dispersed in a mixed solution of ethylene carbonate, ethyl methyl carbonate and diethyl carbonate in a volume ratio of 4:3:3, and a Celgard 2400 polyethylene microporous membrane was used as an electronic diaphragm.

Figure 1:
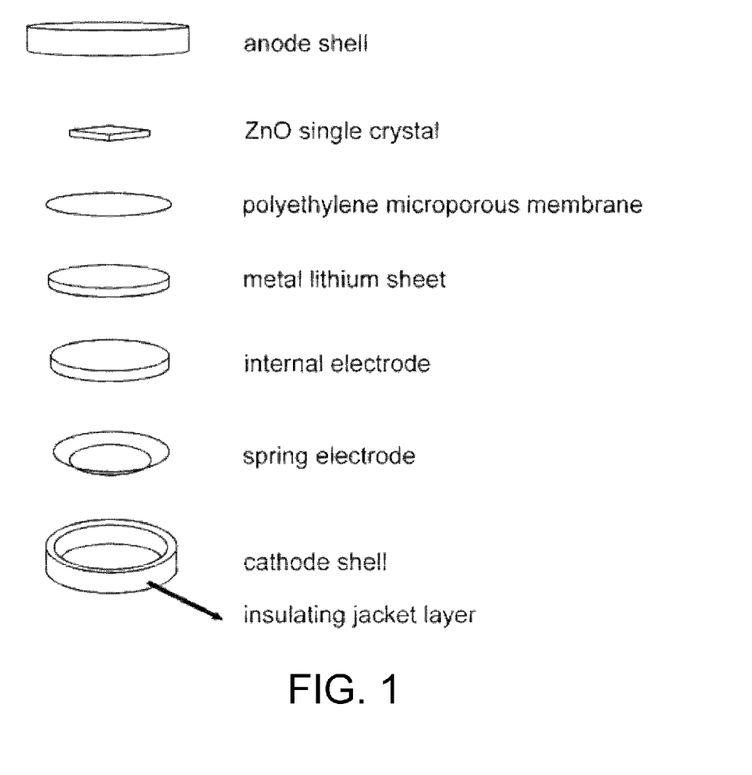
FIG. 1 is a configuration sequence diagram of an electrochemical cell in which a low-resistance zinc oxide crystal wafer is placed in a metal lithium battery shell when preparing a high-resistivity single crystal ZnO.

A LAND BT2013A multi-channel battery testing system performed a constant-current discharge treatment at room temperature to realize an injection of lithium into the ZnO single crystal.

A thickness of the high-quality low-resistance zinc oxide wafer used was 0.3 millimeters, a constant current discharge current was set to 3 µA, and a discharge time was set to 15 hours.

(2) The lithium-injected zinc oxide wafer treated in the above step (1) was placed in a high-temperature and high-pressure annealing furnace, and the lithium in the crystal lattice was removed to obtain a high-resistivity ZnO single crystal wafer.

A lithium removal device used in this Embodiment can withstand a high-temperature high-pressure oxygen atmosphere. According to experimental requirements, an oxygen pressure was set to 20 standard atmosphere pressures, a temperature was set to 800 degrees Celsius, and an annealing time was set to 24 hours.

The high-resistivity ZnO single crystal wafer prepared above had a resistivity of $10^{11}$ Ωcm, which was $10^{11}$ higher than that before the treatment.

Embodiment 2

1. Preparation of high-resistivity single crystal ZnO

The method differed from Embodiment 1 in that the thickness of the ZnO wafer in the step (1) was 0.2 millimeters, the constant current discharge current was set to 3 µA, and the discharge time was set to 10 hours.

Compared with Embodiment 1, this Embodiment shortened the discharge time due to a reduction of the thickness of the wafer, thereby obtaining a same processing result.

2. The high-resistivity ZnO single crystal wafer prepared by this Embodiment had a resistivity of $10^{11}$ Ωcm, which was $10^{11}$ higher than that before treatment.

Embodiment 3

1. Preparation of high-resistivity single crystal ZnO

The method differed from Embodiment 1 in that the thickness of the ZnO wafer in the step (1) was 0.5 millimeters, the constant current discharge current was set to 3 µA, and the discharge time was set to 25 hours.

Compared with Embodiment 1, this Embodiment prolonged the discharge time due to an increase in the thickness of the wafer, thereby obtaining the same processing result.

2. The high-resistivity ZnO single crystal wafer prepared by this Embodiment had a resistivity of $10^{11}$ Ωcm, which was $10^{11}$ higher than that before treatment.

Embodiment 4

1. Preparation of high-resistivity single crystal ZnO (1) A high-quality low-resistance zinc oxide wafer with a thickness of 0.2 millimeters and 10 centimeter squares was assembled into the commercial CR 2032 battery case in the order shown in FIG. 1 at room temperature in the argon-filled glove box, the electrolyte used was the 1 M LiPF6 solution dispersed in a mixture solution of ethylene carbonate, ethyl methyl carbonate and diethyl carbonate in a volume ratio of 1:1:1, and the Celgard 2400 polyethylene microporous membrane was used as the electronic diaphragm.

The LAND BT2013A multi-channel battery testing system performed the constant-current discharge treatment at room temperature to realize the injection of lithium into the ZnO single crystal.

The thickness of the high-quality low-resistance zinc oxide wafer used in this Embodiment was 0.2 millimeters, the constant current discharge current was set to 4 μA, and the discharge time was set to 8 hours.

(2) The lithium-injected zinc oxide wafer treated in the above step (1) was placed in the high-temperature and high-pressure annealing furnace, and the lithium in the crystal lattice was removed to obtain the high-resistivity ZnO single crystal wafer.

The lithium removal device used in this Embodiment can withstand the high-temperature high-pressure oxygen atmosphere. According to the experimental requirements, the oxygen pressure was set to 25 standard atmosphere pressures, the temperature was set to 900 degrees Celsius, and the annealing time was set to 22 hours.

2. The high-resistivity ZnO single crystal wafer prepared by the above had a resistivity of $10^{11}$ Ωcm, which was $10^{11}$ higher than that before treatment.

Embodiment 5

1. Preparation of high-resistivity single crystal ZnO (1) A high-quality low-resistance zinc oxide wafer with a thickness of 0.2 millimeters and 10 centimeter squares was assembled into the commercial CR 2032 battery case in the order shown in FIG. 1 at room temperature in the argon-filled glove box, the electrolyte used was the 1 M LiPF6 solution dispersed in a mixture solution of ethylene carbonate, ethyl methyl carbonate and diethyl carbonate in a volume ratio of 5:4:4, and the Celgard 2400 polyethylene microporous membrane was used as the electronic diaphragm.

The LAND BT2013A multi-channel battery testing system performed the constant-current discharge treatment at room temperature to realize the injection of lithium into the ZnO single crystal.

The thickness of the high-quality low-resistance zinc oxide wafer used in this Embodiment was 0.5 millimeters, the constant current discharge current was set to 3 μA, and the discharge time was set to 25 hours.

(2) The lithium-injected zinc oxide wafer treated in the above step (1) was placed in the high-temperature and high-pressure annealing furnace, and the lithium in the crystal lattice was removed to obtain the high-resistivity ZnO single crystal wafer.

The lithium removal device used in this Embodiment can withstand the high-temperature high-pressure oxygen atmosphere. According to the experimental requirements, the oxygen pressure was set to 15 standard atmosphere pressures, the temperature was set to 900 degrees Celsius, and the annealing time was set to 26 hours.

2. The high-resistivity ZnO single crystal wafer prepared by the above had a resistivity of $10^{11}$ Ωcm, which was $10^{11}$ higher than that before treatment.

Embodiment 6

1. Preparation of High-Resistivity Single Crystal ZnO-Based Radiation Detector

Figure 2:
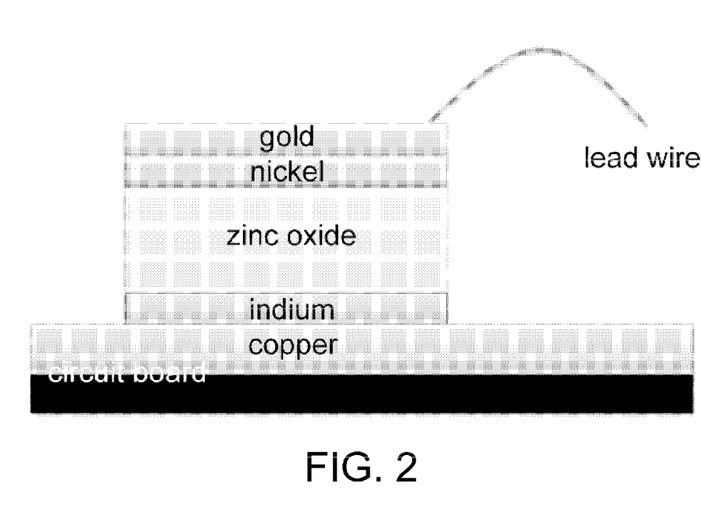
FIG. 2 is an assembly structure diagram of the high-resistivity ZnO device of Embodiment 6.

Using a thermal/electron beam evaporation method, a surface of one side of the high-resistivity ZnO wafer was evaporated with a two-layer metal electrode of 5 nm of nickel and 20 nm of gold in the order shown in FIG. 2, wherein the metal used had a purity of 999 to 9999.

A thicker (1 μm to 500 μm) metal indium electrode was then plated on the other side of the ZnO wafer.

Both sides of the electrode formed a good electrical contact.

The wafer was bonded to a circuit board by molten indium through a heating device and the wafer was connected to the circuit board by a gold thread.

2. Testing

Figure 3:
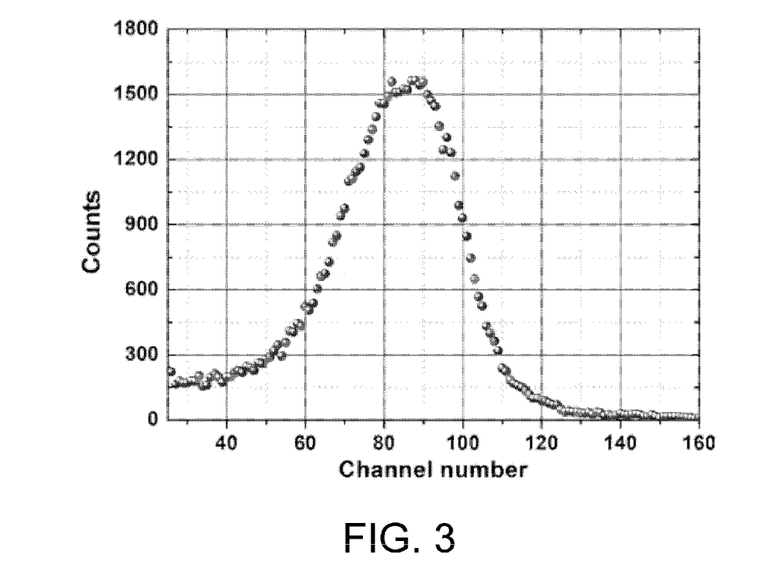
FIG. 3 is an alpha particle test response data of Embodiment 6.

The obtained high-resistivity single crystal ZnO-based radiation detector was placed in a vacuum to reduce an energy loss of alpha particles during flight. A response test of the detector utilized a 5.486 MeV alpha-ray irradiation detector from a $^{241}$Am radiation source. counted by a front amplifier, and then a signal was transmitted to a main amplifier and transmitted to a multi-channel analyzer, and finally the signal was collected by a microcomputer, as shown in FIG. 3.

The above results show that the high-resistivity single crystal ZnO-based detector has obvious practical capability in the field of radiation detection, and especially its effective response to weak alpha source reflects the sensitivity of the device.

Embodiment 7

1. A high-resistivity ZnO single crystal was prepared with the method same as Embodiment 1.

2. Preparation of High-Resistivity Single Crystal ZnO-Based Radiation Detector

Figure 4:
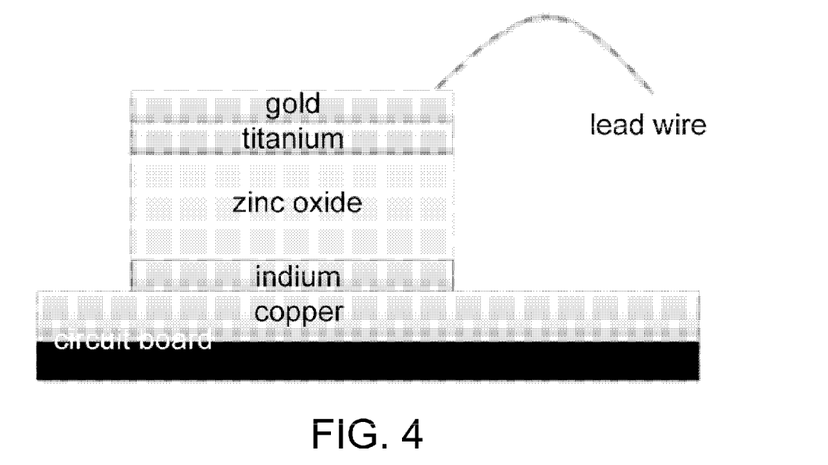
FIG. 4 is an assembly structure diagram of the high-resistivity ZnO device of Embodiment 7.

Using the thermal/electron beam evaporation method, the surface of one side of the high-resistivity ZnO wafer was evaporated with a two-layer metal electrode of 35 nm of titanium and 20 nm of gold in the order shown in FIG. 4.

The thicker metal indium electrode was then plated on the other side of the ZnO wafer.

Both sides of the electrode formed a good electrical contact.

The wafer was bonded to the circuit board by molten indium through the heating device and the wafer was connected to the circuit board by the gold thread.

3. Testing

Figure 5:
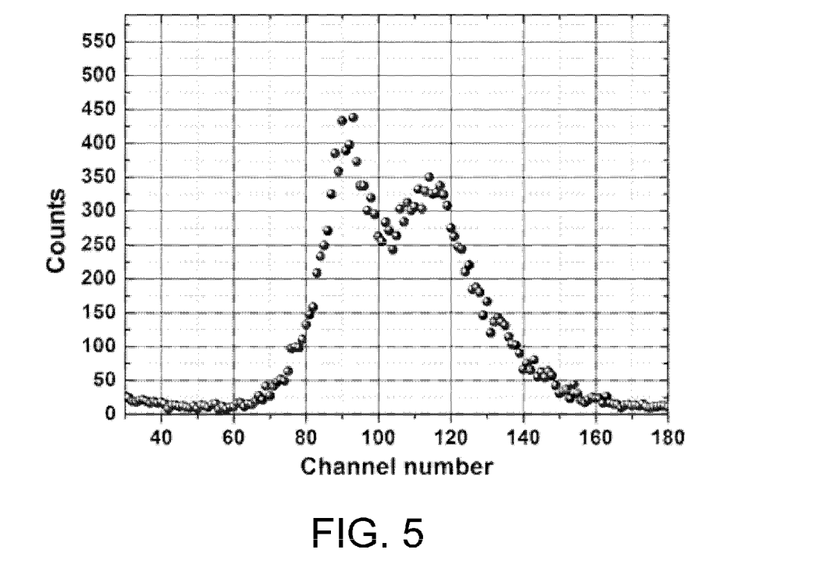
FIG. 5 is an alpha particle test response data of Embodiment 7.
Figure 6:
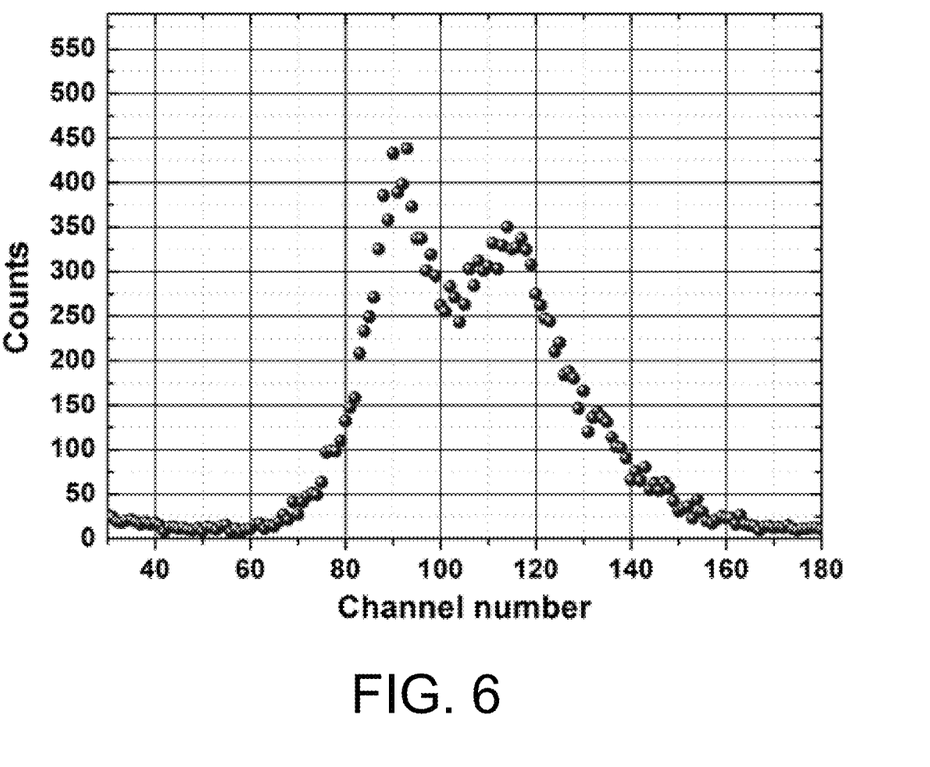

The obtained high-resistivity ZnO-based radiation detector was placed in a vacuum to reduce an energy loss of alpha particles during flight. A response test of the detector utilized a $^{243}$Am-$^{244}$Cm dual-energy radiation alpha source illumination detector. front amplifier, and then the signal was transmitted to the main amplifier and transmitted to the multi-channel analyzer, and finally the signal was collected by the microcomputer, as shown in FIG. 5.

The above results show that the high-resistivity single crystal ZnO-based detector has obvious practical capability in the field of radiation detection, and especially its effective response to the dual alpha source and distinction reflect that the device has excellent capability of energy resolution.

Embodiment 8

1. A high-resistivity ZnO single crystal was prepared with the method same as Embodiment 1.

2. Preparation of high-resistivity single crystal ZnO-based radiation detector

Using the thermal/electron beam evaporation method, the surface of one side of the high-resistivity ZnO wafer was evaporated with a two-layer metal electrode of 4 nm of nickel and 10 nm of gold in the order shown in FIG. 2, wherein the metal used had a purity of 999 to 9999.

A thicker (1 μm to 500 μm) metal indium electrode was then plated on the other side of the ZnO wafer.

Both sides of the electrode formed a good electrical contact.

The wafer was bonded to the circuit board by molten indium through the heating device and the wafer was connected to the circuit board by the gold thread.

3. Testing

The obtained high-resistivity ZnO-based detector was placed in a vacuum to reduce an energy loss of alpha particles during flight. A response test of the detector utilized the $^{243}$Am-$^{244}$Cm dual-energy radiation alpha source illumination detector. It was counted by the front amplifier, and then the signal was transmitted to the main amplifier and transmitted to the multi-channel analyzer, and finally the signal was collected by the microcomputer.

The results show that the high-resistivity single crystal ZnO-based detector has obvious practical capability in the field of radiation detection, and especially its effective response to the dual alpha source and distinction effect that the device has excellent capability of energy resolution.

Embodiment 9

1. A high-resistivity ZnO single crystal was prepared with the method same as Embodiment 1.

2. Preparation of high-resistivity single crystal ZnO-based radiation detector

Using the thermal/electron beam evaporation method, the surface of one side of the high-resistivity ZnO wafer was evaporated with a two-layer metal electrode of 5 nm of titanium and 10 nm of gold in the order shown in FIG. 4.

A thicker (1 m to 500 m) metal indium electrode was then plated on the other side of the ZnO wafer.

Both sides of the electrode formed a good electrical contact.

The wafer was bonded to the circuit board by molten indium through the heating device and the wafer was connected to the circuit board by the gold thread.

3. Testing

The obtained high-resistivity ZnO-based detector was placed in a vacuum to reduce an energy loss of alpha particles during flight. A response test of the detector utilized the $^{243}$Am-$^{244}$Cm dual-energy radiation alpha source illumination detector. It was counted by the front amplifier, and then the signal was transmitted to the main amplifier and transmitted to the multi-channel analyzer, and finally the signal was collected by the microcomputer.

The results show that the high-resistivity single crystal ZnO-based detector has obvious practical capability in the field of radiation detection, and especially its effective response to the dual alpha source and distinction reflect that the device has excellent capability of energy resolution.

Embodiment 10

1. A high-resistivity ZnO single crystal was prepared with the method same as Embodiment 1.

2. Preparation of high-resistivity single crystal ZnO-based radiation detector

Using the thermal/electron beam evaporation method, the surface of one side of the high-resistivity ZnO wafer was evaporated with a two-layer metal electrode of 6 nm of nickel and 50 nm of gold in the order shown in FIG. 2, wherein the metal used had a purity of 999 to 9999.

A thicker (1 μm to 500 μm) metal indium electrode was then plated on the other side of the ZnO wafer.

Both sides of the electrode formed a good electrical contact.

The wafer was bonded to the circuit board by molten indium through the heating device and the wafer was connected to the circuit board by the gold thread.

3. Testing

The obtained high-resistivity ZnO-based detector was placed in a vacuum to reduce an energy loss of alpha particles during flight. A response test of the detector utilized the $^{243}$Am-$^{244}$Cm dual-energy radiation alpha source illumination detector. It was counted by the front amplifier, and then the signal was transmitted to the main amplifier and transmitted to the multi-channel analyzer, and finally the signal was collected by the microcomputer.

The results show that the high-resistivity single crystal ZnO-based detector has obvious practical capability in the field of radiation detection, and especially its effective response to the dual alpha source and distinction reflect that the device has excellent capability of energy resolution.

Embodiment 11

1. A high-resistivity ZnO single crystal was prepared with the method same as Embodiment 1.

2. Preparation of high-resistivity single crystal ZnO-based radiation detector

Using the thermal/electron beam evaporation method, the surface of one side of the high-resistivity ZnO wafer was evaporated with a two-layer metal electrode of 50 nm of titanium and 50 nm of gold in the order shown in FIG. 4.

A thicker (1 μm to 500 μm) metal indium electrode was then plated on the other side of the ZnO wafer.

Both sides of the electrode formed a good electrical contact.

The wafer was bonded to the circuit board by molten indium through the heating device and the wafer was connected to the circuit board by the gold thread.

3. Testing

The obtained high-resistivity ZnO-based detector was placed in a vacuum to reduce an energy loss of alpha particles during flight. A response test of the detector utilized the $^{243}$Am-$^{244}$Cm dual-energy radiation alpha source illumination detector. It was counted by the front amplifier, and then the signal was transmitted to the main amplifier and transmitted to the multi-channel analyzer, and finally the signal was collected by the microcomputer.

The results show that the high-resistivity single crystal ZnO-based detector has obvious practical capability in the field of radiation detection, and especially its effective response to the dual alpha source and distinction reflect that the device has excellent capability of energy resolution.

Embodiment 12

1. A high-resistivity ZnO single crystal was prepared with the method same as Embodiment 1.

2. Preparation of high-resistivity single crystal ZnO-based radiation detector

Using the thermal/electron beam evaporation method, surfaces of both sides of the high-resistivity ZnO wafer were evaporated with a metal layer.

It differed from Embodiment 7 in that: the metal layer evaporated on the both sides is symmetrical, that is, the both sides are evaporated with an inner metal layer of 35 nm of titanium and an outer metal layer of 20 nm of gold.

A thicker metal indium electrode was then plated on the other side of the ZnO wafer.

Both sides of the electrode formed a good electrical contact.

The wafer was bonded to the circuit board by molten indium through the heating device and the wafer was connected to the circuit board by the gold thread.

3. Testing

The obtained high-resistivity ZnO-based detector was placed in a vacuum to reduce an energy loss of alpha particles during flight. A response test of the detector utilized the $^{243}$Am-$^{244}$Cm dual-energy radiation alpha source illumination detector, front amplifier, and then the signal was transmitted to the main amplifier and transmitted to the multi-channel analyzer, and finally the signal was collected by the microcomputer, as shown in FIG. 5.

The results show that the high-resistivity single crystal ZnO-based detector has obvious practical capability in the field of radiation detection, and especially its effective response to the dual alpha source and distinction reflect that the device has excellent capability of energy resolution.

The above-described embodiments are preferred implementations of the present invention, but the implementations of the present invention are not limited by the embodiments. Any other changes, modifications, substitutions, combinations, and simplifications made without departing from the spirit and principles of the present invention shall be equivalent substitutions, and are all included in the scope of protection of the present invention.

What is claimed:

1. A preparation method of high-resistivity single crystal zinc oxide, wherein the preparation method comprises following steps:
    S1) placing a single crystal ZnO wafer in a metal lithium electrochemical device, for a constant-current discharge treatment; and
    S2) placing a ZnO single crystal treated in the step S1 in an oxygen atmosphere at 600 to 1000° C. and 5 to 30 atm for an annealing treatment for 10 to 28 hours to obtain a high-resistivity ZnO single crystal wafer.

2. The preparation method according to claim 1, wherein an electrolyte in the metal lithium electrochemical device mentioned in the step S1 is a 0.5 to 1.5M LiPF$_6$ solution dispersed in a mixed solution of ethylene carbonate, ethyl methyl carbonate and diethyl carbonate in a volume ratio of 2 to 5:2 to 4:2 to 4, and a polyethylene microporous membrane is used as an electronic diaphragm.

3. The preparation method according to claim 1, wherein the metal lithium electrochemical device mentioned in the step S1 is a lithium battery shell.

4. The preparation method according to claim 1, wherein a means of placing the single crystal ZnO wafer in the metal lithium electrochemical device mentioned in the step S1 is specifically assembling the single crystal ZnO wafer into a lithium battery shell in following order: an anode shell, the single crystal ZnO wafer, a polyethylene microporous membrane, a metal lithium sheet, an internal electrode, a spring electrode, a cathode shell.

5. The preparation method according to claim 1, wherein the constant-current discharge treatment mentioned in the step S1 is 1 to 4 μA constant-current discharge treatment for 10 to 25 hours.

6. The preparation method according to claim 5, wherein the constant-current discharge treatment mentioned in the step S1 is 3 μA constant-current discharge treatment for 15 hours.

7. The preparation method according to claim 1, wherein in the step S2, the ZnO single crystal treated in the step S1 is placed in an oxygen atmosphere furnace at 800 to 900° C. and 15 to 25 atm for the annealing treatment for 22 to 26 hours.

8. The preparation method according to claim 1, wherein in the step S2, the ZnO single crystal treated in the step S1 is placed in a high-pressure oxygen atmosphere at 800° C. and 20 atm for the annealing treatment for 24 hours.

9. A high-resistivity single crystal ZnO prepared by the preparation method according to claim 1.

10. Use of the high-resistivity single crystal ZnO according to claim 9 in preparing a radiation detector or a photoelectric detector.

11. A preparation method of a high-resistivity single crystal ZnO-based radiation detector, wherein the preparation method comprises following steps:
    S1) preparing a high-resistivity single crystal ZnO wafer;
    S2) evaporating a metal electrode layer at both sides of the high-resistivity single crystal ZnO wafer; and
    S3) bonding the wafer treated in the step S2 onto a circuit board, and connecting the wafer to the circuit board by a gold thread, wherein evaporating the metal electrode layer at the both sides of the high-resistivity single crystal ZnO wafer mentioned in the step S2 is specifically as follows: evaporating an inner metal layer and an outer metal layer at a side of the high-resistivity single crystal ZnO wafer, the inner metal layer being a nickel layer, a titanium layer or an aluminum layer, the outer metal layer being a gold layer or a silver layer; evaporating an indium layer at an other side of the high-resistivity single crystal ZnO wafer, or evaporating an inner metal layer and an outer metal layer at an other side of the high-resistivity single crystal ZnO wafer, the inner metal layer being a nickel layer, a titanium layer or an aluminum layer, the outer metal layer being a gold layer or a silver layer.

12. The preparation method according to claim 11, wherein a means of evaporating mentioned in the step S2 is a thermal evaporation method or an electron beam evaporation method.

13. The preparation method according to claim 11, wherein a metal of the metal electrode layer mentioned in the step S2 has a purity of 999 to 9999.

14. The preparation method according to claim 11, wherein the nickel layer has a thickness of 4 to 6 nm, the titanium layer has a thickness of 5 to 50 nm, and the gold layer has a thickness of 10 to 50 nm.

15. The preparation method according to claim 11, wherein the indium layer has a thickness of 1 μm to 500 μm.

16. The preparation method according to claim 11, wherein a specific means of bonding the wafer onto the circuit board mentioned in the step S3 is: melting the metal electrode layer at a side by heating, binding the wafer onto the circuit board by the molten metal electrode layer.

17. The preparation method according to claim 11, wherein a preparation method of the high-resistivity single crystal ZnO wafer mentioned in the step S1 is as follows: placing the single crystal ZnO wafer in a metal lithium electrochemical device, after a constant-current discharge treatment, placing the single crystal ZnO wafer in an oxygen atmosphere at 800 to 1000° C. and 10 to 30 atm for an annealing treatment for 20 to 28 hours to obtain a high-resistivity ZnO single crystal wafer.

18. A high-resistivity single crystal ZnO-based radiation detector prepared by the preparation method according to claim 11.

19. A preparation method of a high-resistivity single crystal ZnO-based radiation detector, wherein the preparation method comprises following steps:
   S1) preparing a high-resistivity single crystal ZnO wafer;
   S2) evaporating a metal electrode layer at both sides of the high-resistivity single crystal ZnO wafer; and
   S3) bonding the wafer treated in the step S2 onto a circuit board, and connecting the wafer to the circuit board by a gold thread, wherein a preparation method of the high-resistivity single crystal ZnO wafer mentioned in the step S1 is as follows: placing the single crystal ZnO wafer in a metal lithium electrochemical device, after a constant-current discharge treatment, placing the single crystal ZnO wafer in an oxygen atmosphere at 800 to 1000° C. and 10 to 30 atm for an annealing treatment for 20 to 28 hours to obtain a high-resistivity ZnO single crystal wafer.

20. A high-resistivity single crystal ZnO-based radiation detector prepared by the preparation method according to claim 19.

* * * * *